(12) United States Patent
Sakaue

(10) Patent No.: US 11,751,340 B2
(45) Date of Patent: Sep. 5, 2023

(54) METHOD OF PRODUCING WIRING BOARD THAT INCLUDES DUAL-LAYERED INSULATING FILM

(71) Applicant: JAPAN AVIATION ELECTRONICS INDUSTRY, LIMITED, Tokyo (JP)

(72) Inventor: Akitoshi Sakaue, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 17/547,576

(22) Filed: Dec. 10, 2021

(65) Prior Publication Data

US 2022/0217850 A1 Jul. 7, 2022

(30) Foreign Application Priority Data

Jan. 7, 2021 (JP) ................................ 2021-001224

(51) Int. Cl.
*H05K 3/46* (2006.01)
*H05K 1/02* (2006.01)
*H05K 3/10* (2006.01)

(52) U.S. Cl.
CPC ............. *H05K 3/46* (2013.01); *H05K 1/0298* (2013.01); *H05K 3/10* (2013.01); *H05K 2203/0502* (2013.01); *Y10T 29/49147* (2015.01)

(58) Field of Classification Search
CPC .................. H05K 3/1283; H05K 1/115; H05K 2203/0502; H05K 1/0393; H05K 3/386; H05K 3/46; Y10T 29/49147; Y10T 29/49155

USPC .................................... 29/842, 825, 829, 846
See application file for complete search history.

(56) References Cited

U.S. PATENT DOCUMENTS 10,675,902 B2 * 6/2020 Sakaue ................. B41M 3/006

FOREIGN PATENT DOCUMENTS

| JP | 2001051259 | * | 8/1999 |
| JP | 2001-051259 | A | 2/2001 |
| JP | 2012-064884 | A | 3/2012 |

OTHER PUBLICATIONS

Office Action issued in corresponding Korean Patent Application No. 10-2021-0170915 dated Mar. 10, 2023, along with English translation thereof.

* cited by examiner

*Primary Examiner* — Thiem D Phan
(74) *Attorney, Agent, or Firm* — GREENBLUM & BERNSTEIN, P.L.C.

(57) ABSTRACT

A wiring board includes a conductor pattern formed on a board, and an insulating film that covers at least part of the conductor pattern. A first insulating film is provided in a first region on the board, the first region covering at least part of the conductor pattern and having a first border segment. A second insulating film is provided in a second region on the board, the second region covering at least part of the first region and having a second border segment. The second border segment is located outside the first region, and the shortest distance from any point belonging to the second border segment to the first border segment is not more than 400 μm.

4 Claims, 8 Drawing Sheets

METHOD OF PRODUCING WIRING BOARD THAT INCLUDES DUAL-LAYERED INSULATING FILM

TECHNICAL FIELD

The present invention relates to a production method of a wiring board including a conductor pattern formed on a board and an insulating film that is formed by flexographic printing and covers at least a part of the conductor pattern, and more particularly, to a wiring board produced by the production method.

BACKGROUND ART

Japanese Patent Application Laid Open No. 2001-51259 (referred to below as Patent Literature 1) describes the formation of a surface protective film (insulating film) covering an electrode pattern formed on a board using flexographic printing in the board used for liquid crystal apparatuses. FIGS. 1A, 1B, 2A, and 2B illustrate how an insulating film is formed by the flexographic printing, which is described in Patent Literature 1, reference numeral 11 represents the board and reference numeral 12 represents the electrode pattern in FIGS. 1A, 1B, 2A, and 2B. In addition, reference numerals 13, 13a, and 13b respectively represent a coating film, a lower coating film, and an upper coating film which are formed by transferring and applying a liquid precursor for forming an insulating film.

Patent Literature 1 describes the following with reference to FIGS. 1A, 1B, 2A, and 2B.

1) When the liquid precursor is applied by flexographic printing, the portion of the coating film 13 near an border segment 14 becomes a protuberance with a height approximately twice the film thickness of the inner area as illustrated in FIG. 1A and, when this protuberance 15 is approximately 1500 Å, cracks occur in cleaning or rubbing treatment. Such cracks cause peeling of the coating film 13. In FIG. 1A, the upper limit of the thickness of the surface protective film is 750 Å.

2) When the lower coating film 13a is formed by flexographic printing, the upper coating film 13b is formed by flexographic printing again, and then the upper coating film 13b and the lower coating film 13a are cured as illustrated in FIG. 1B, cracks occur in the subsequent cleaning and rubbing treatment when a protuberance 16 near the border segment 14 reaches approximately 2000 Å. In FIG. 1B, the upper limit of the thickness of the surface protective film is 1000 Å.

3) The lower coating film 13a having a film thickness of approximately 650 Å is formed as illustrated in FIG. 2A and then the upper coating film 13b having a film thickness of 650 Å is formed as illustrated in FIG. 2B. At this time, the upper coating film 13b is formed so that an border segment 18 of the upper coating film 13b is located approximately 200 μm inward of the border segment 14 of the lower coating film 13a. A protuberance 19 of the upper coating film 13b does not overlap a protuberance 17 of the lower coating film 13a and the sum of the film thicknesses of the lower coating film 13a and the film thicknesses of the upper coating film 13b is approximately 1950 Å, which is less than 2000 Å, even at the position (position at which the protuberance 19 is generated) at which the sum of the film thicknesses is maximum. Accordingly, since a surface protective film having a film thickness of 1300 Å can be formed and the film thickness of the portion at which the protuberance 19 is generated is only 1950 Å in FIGS. 2A and 2B, no cracks occur.

As described above, Patent Literature 1 describes that, in the formation of an insulating film by flexographic printing, cracks occur when a protuberance generated near the border segment of an insulating film is thick, and the insulating film is formed via double-coating by displacing the border segments from each other to form a thick insulating film while avoiding the occurrence of cracks.

By forming the insulating film by superposition printing of two layers as described above, it is possible to form an insulating film having a film thickness thicker than the maximum film thickness that can be formed by single printing and prevent the occurrence of a problem such as communication between both sides (upper and lower sides) of the insulating film through pinholes penetrating in the film thickness direction that may be generated in the insulating film having been printed and formed.

However, when the insulating film is formed by superposition printing of two layers, superposition printing is performed in a form as described in Patent Literature 1, that is, in a form in which the border segment of the second layer, which is formed on the first layer being a lower layer, is recessed into the area of the film from the border segment of the first layer, a valley with a remarkable film thickness is formed between the protuberance 17 near the border segment of the first layer and the protuberance 19 near the border segment of the second layer as illustrated in FIG. 2B.

This valley causes a problem in that when, for example, a layer of an optical clear adhesive (OCA) is disposed on the insulating film and an optical member such as a cover is mounted on this layer, air bubbles are generated (air bubbles are trapped) between the insulating film and the optical clear adhesive layer in the valley, and the presence of such air bubbles along, for example, the periphery of the insulating film disables proper adhesion, thereby making the mounting strength insufficient.

In addition, for example, when the valley of the insulating film is present in a visible area of the device, the surface of this portion looks distorted, interference fringes are generated, or other visual problems occur.

As described above, FIGS. 3 and 4 illustrate how air bubbles are generated when a cover 24 is mounted on first and second insulating films 21 and 22 having the forms illustrated in FIG. 2B via an optical clear adhesive layer 23. In FIGS. 3 and 4, reference character 21a represents the protuberance near the border segment of the first insulating film 21 and reference character 22a represents the protuberance near the border segment of the second insulating film 22. Reference numeral 25 represents the air bubble generated (remaining) in the valley between the protuberances 21a and 22a. In addition, reference numeral 26 represents a board and reference numeral 27 represents a conductor pattern. It should be noted that FIG. 4 illustrates the state in which the air bubbles 25 are generated in the valleys between the protuberances 21a and 22a around a through-hole 28 when the through-hole 28 is provided in the insulating film.

BRIEF SUMMARY OF THE INVENTION

The present invention addresses such situations with an object of providing a production method that prevents valleys from being formed on the surface of an insulating film in the production of a wiring board including the insulating film formed by superposition printing of flexographic printing, and further providing a wiring board that includes an insulating film with the two-layer structure and has no valleys on the surface of the insulating film.

The technical matters described herein are not intended to expressly or implicitly limit the invention described in the claims and express the possibility of accepting such limitation by persons other than those who benefit from the present invention (for example, the applicant and the right holder), but are merely provided for easy understanding of the gist of the present invention. The outline of the present invention from another point of view can be understood from, for example, the claims at the time of filing of this patent application.

Although the term "wiring board" is used in this specification, "wiring board" is paraphrased as "printed board" in this section. The printed board according to the present invention includes a board and a printed structure on the board. The printed structure includes an insulating layer on the board or the printed structure includes a conductive layer having a pattern formed of a conductor and an insulating layer on the conductive layer. When the printed structure includes a conductive layer, the conductive layer is formed directly or indirectly on the board, in other words, the conductive layer is formed on the board or the base layer. The insulating layer has the following characteristics.

The insulating layer includes a first cured coating layer made of first insulating ink and a second cured coating layer made of second insulating ink. The material of the second insulating ink may be the same as or different from that of the first insulating ink. The ratio of the thickness of the first cured coating layer to the area of the first cured coating layer is generally sufficiently small. That is, the first cured coating layer generally has a thin film shape. The ratio of the thickness of the second cured coating layer to the area of the second cured coating layer is generally sufficiently small. That is, the second cured coating layer generally has a thin film shape. The first cured coating layer is located below the second cured coating layer and the first cured coating layer and the second cured coating layer are in contact with each other. The two-layer structure of the first cured coating layer and the second cured coating layer included in the insulating layer may be observed from the cross section of the insulating layer. The edge of the first cured coating layer is covered with the second cured coating layer. In the area between the edge of the first cured coating layer and the edge of the second cured coating layer, the second cured coating layer is located on the board, the base layer, or the conductive layer. The shortest distance from any point on the edge of the second cured coating layer to the edge of the first cured coating layer is more than 0 µm and not more than 400 µm, preferably not less than 50 µm and not more than 400 µm, more preferably not less than 100 µm and not more than 400 µm, and most preferably not less than 200 µm and not more than 400 µm.

When the printed structure includes an insulating layer on the board, the method of manufacturing a printed board includes: applying the first insulating ink onto the board; forming the first cured coating layer by curing the first insulating ink; applying the second insulating ink onto the first cured coating layer in which the second insulating ink is applied beyond the edge of the first cured coating layer by a distance more than 0 µm and not more than 400 µm—in other words, the second insulating ink covers the edge of the first cured coating layer—; and forming the second cured coating layer by curing the second insulating ink.

When the printed structure includes a conductive layer and an insulating layer, the method of manufacturing a printed board includes: applying the first insulating ink onto the conductive layer; forming the first cured coating layer by curing the first insulating ink; applying the second insulating ink onto the first cured coating layer in which the second insulating ink is applied beyond the edge of the first cured coating layer by a distance more than 0 µm and not more than 400 µm—in other words, the second insulating ink covers the edge of the first cured coating layer—; and forming the second cured coating layer by curing the second insulating ink.

The application of the insulating ink is performed by printing—preferably, flexographic printing—.

Effects of the Invention

According to the present invention, in the production of a wiring board including an insulating film formed by superposition printing of flexographic printing, it is possible to provide a production method that prevents valleys from being formed on a surface near the border segment of the insulating film including the first insulating film and the second insulating film which undergo superposition printing.

In addition, in the wiring board according to the present invention, no valleys are present on a surface near the border segment of the insulating film having the two-layer structure.

LIST OF REFERENCE NUMERALS

Figure 1A:
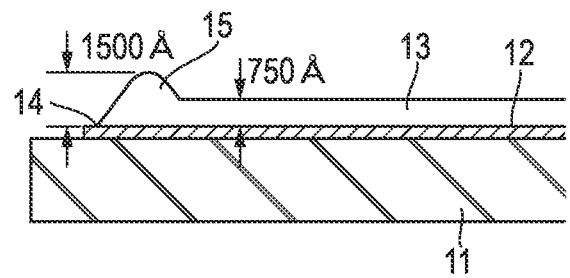
FIG. 1A is a sectional view illustrating a portion near an border segment of an insulating film formed by conventional flexographic printing.
Figure 1B:
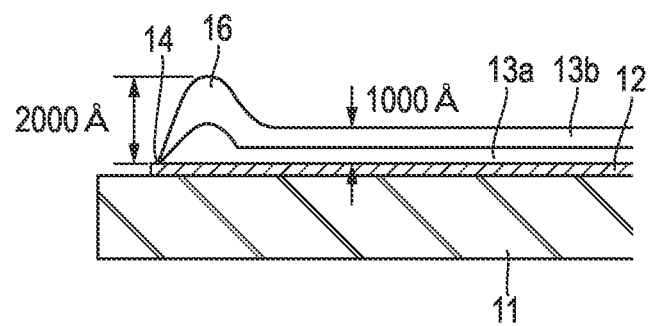
FIG. 1B is a sectional view illustrating a portion near border segments of insulating films formed via double-coating (superposition printing) by conventional flexographic printing.
Figure 2A:
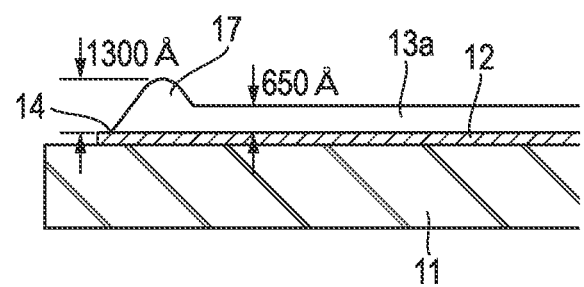
FIG. 2A is a sectional view illustrating a portion near an border segment of an insulating film formed by conventional flexographic printing.
Figure 2B:
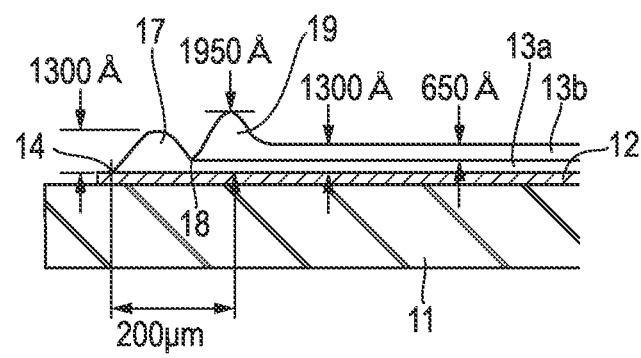
FIG. 2B is a sectional view illustrating the state in which an insulating film undergoes superposition printing on the insulating film in FIG. 2A by flexographic printing with the border segments thereof deviated from each other.

11: board
12: electrode pattern
13: coating film
13a: lower coating film
13b: upper coating film
14: border segment
15, 16, 17, 19: protuberance
18: border segment
21: first insulating film
21a: protuberance
22: second insulating film
22a: protuberance
23: optical clear adhesive layer
24: cover
25: air bubble
26: board
27: conductor pattern
28: through-hole
31: board
32: conductor pattern
40: insulating film
41: first insulating film
41a: protuberance
42: second insulating film
50: clear board
61: first sensor electrode row
61a: island electrode
61b: coupling portion
62: second sensor electrode row
62a: island electrode
62b: coupling portion
62c: connection portion
71, 72: lead-out wire
72a: connection portion
73: terminal portion
81: first conductor pattern
82: second conductor pattern
83: optical clear adhesive layer
84: cover
90: insulating film
91: first insulating film
92: second insulating film
93: through-hole

DETAILED DESCRIPTION

An embodiment of the present invention will be described using examples with reference to the drawings.

Figure 5A:
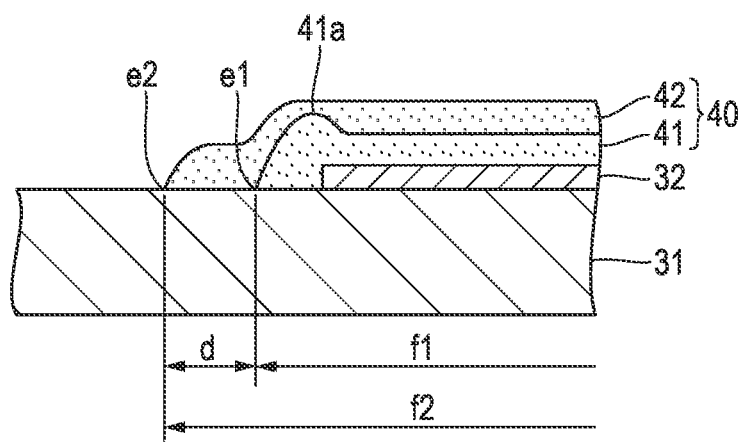
FIG. 5A is a sectional view illustrating the shapes of the main portions of the insulating films in a wiring board according to the present invention.

FIG. 5A illustrates a portion near an border segment of an insulating film 40 of a wiring board according to the present invention. The wiring board includes a conductor pattern 32 formed on a board 31 and the insulating film 40 that covers at least a part of the conductor pattern 32, in which the insulating film 40 includes a first insulating film 41 and a second insulating film 42.

Although the overall structure is not illustrated in FIG. 5A, the first insulating film 41 is provided in a first region f1 on the board 31 that covers at least a part of the conductor pattern 32. The second insulating film 42 is provided in a second region f2 on the board 31 that covers at least a part of the first region f1.

In FIG. 5A, reference character e1 represents the border segment (first border segment) of the first region f1 and reference character e2 represents the border segment (second border segment) of the second region f2. In this example, the border segment e2 is disposed outside the first region f1, and the shortest distance d from any point belonging to the border segment e2 to the border segment e1 is not more than 400 µm.

The insulating film 40 including the first insulating film 41 and the second insulating film 42 described above is formed by flexographic printing, and the forming steps of the insulating film 40 will be sequentially described below.

(1) First Printing Step

The first printing step transfers the first ink of insulating film material to the first region f1 from a first flexographic plate.

(2) First Curing Step

The first curing step cures the first ink of insulating film material transferred to the first region f1. This forms the first insulating film 41 and forms a protuberance 41a of the film thickness extending along the border segment e1 on the first insulating film 41.

(3) Second Printing Step

The second printing step transfers the second ink of insulating film material to the second region f2 from a second flexographic plate.

(4) Second Curing Step

The second curing step cures the second ink of insulating film material transferred to the second region f2. This forms the second insulating film 42, that is, completes the insulating film 40 including the first insulating film 41 and the second insulating film 42.

In the steps described above, the first insulating film material and the second insulating film material have the same composition in this example and are insulating film materials such as, for example, polyimide, epoxy resin, and acrylic resin. The first and second inks of insulating film materials are cured only by heat treatment. Specifically, both the first curing step and the second curing step include the following two processes.

1) Temporal drying for three minutes at 60° C.
2) Final drying for ten minutes at 160° C.

When the positional relationship between the border segments e1 and e2 of the first and second regions f1 and f2 in which the first and second insulating films 41 and 42 are respectively formed is defined and the second ink of insulating film material is transferred to the area that covers the border segment e1 from above the cured first insulating film 41 and extends to the outside as described above, the second ink of insulating film material compensates for the height difference of the film thickness of the first insulating film 41 due to the fluidity thereof, completely cancels the protuberance 41a of the film thickness existing near the border segment e1 of the first insulating film 41, and buries the protuberance 41a.

Such an action of the second ink of insulating film material is obtained because the surface of the cured first insulating film 41 has an affinity for the second ink of insulating film material while the surface of the board 31 has no affinity for the ink.

That is, because of the noticeable contrast between good wettability to the surface of the cured first insulating film 41 and good repelling to the surface of the board 31 which forms a large contact angle at the border segment e2, the second ink of insulating film material climbs over the protuberance 41a of the first insulating film 41 with a low resistance from above the first insulating film 41 and flows well to and stays in the area on the surface of the board 31 between the border segments e1 and e2.

Figure 5B:
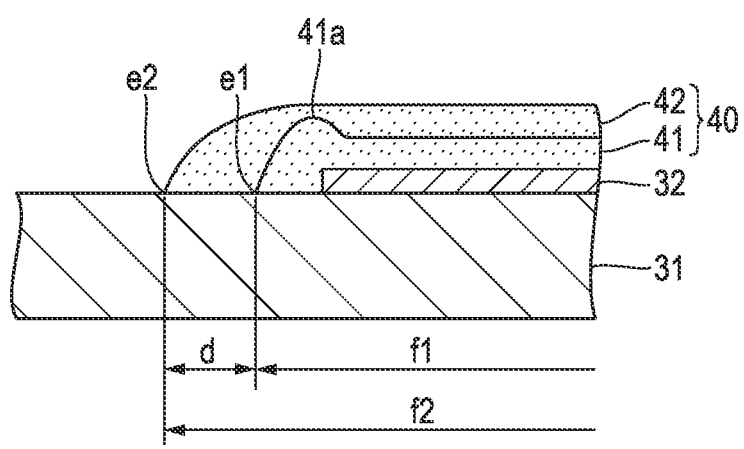
FIG. 5B is a sectional view illustrating shapes that are different from those in FIG. 5A, which are formed by a portion near the border segments of the insulating films.

As described above, in this example, the second insulating film 42 exerts a high leveling effect, and the surface shape near the border segment of the insulating film 40 eventually descends gently, becomes substantially horizontal once in the middle, and descends gently again as illustrated in FIG. 5A, or the surface shape descends while drawing a monotonous slope as illustrated in FIG. 5B. A protuberance of the film thickness is not formed basically near the border segment e2 of the second insulating film 42 and does not have a significant size even if a protuberance is formed. Accordingly, no valleys are formed on the surface of the insulating film 40 in this example. It should be noted that the maximum value of the protuberance 41a of the film thickness formed on the first insulating film 41 is generally not less than one and half times the minimum value of the film thickness of the first insulating film 41.

The distance (shortest distance) d between the border segments e1 and e2 is not more than 400 μm in the example described above. When the distance d exceeds 400 μm, the influence of the second ink of insulating film material that has climbed over the protuberance 41a of the first insulating film 41 from above the first insulating film 41 and flowed does not reach the portion near the border segment e2 and the protuberance of the film thickness along the border segment e2 of the second insulating film 42 becomes apparent. Accordingly, the insulating film 40 having no valleys on the surface described above can be obtained satisfactorily under the condition that the distance d is not more than 400 μm. It should be noted that the distance d between the border segments e1 and e2 is preferably set to be not too small and rather large within the range not more than 400 μm.

Figure 3:
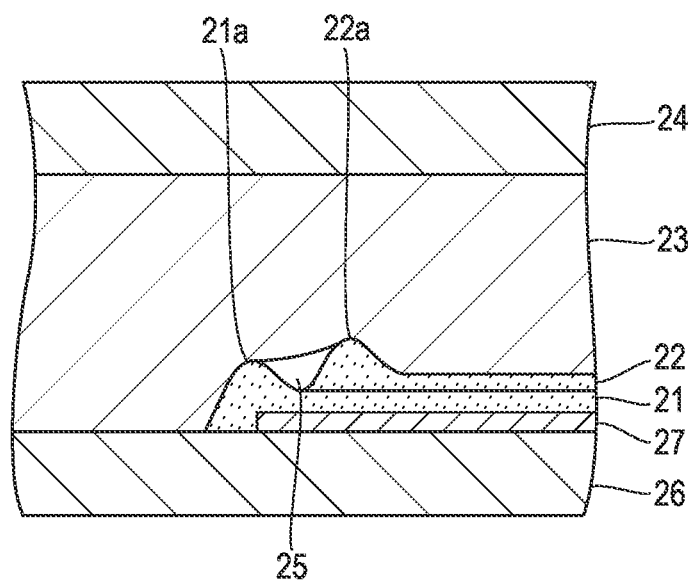
FIG. 3 is a sectional view illustrating the state in which a cover is mounted on the same structure as in FIG. 2B via an optical clear adhesive layer.
Figure 4:
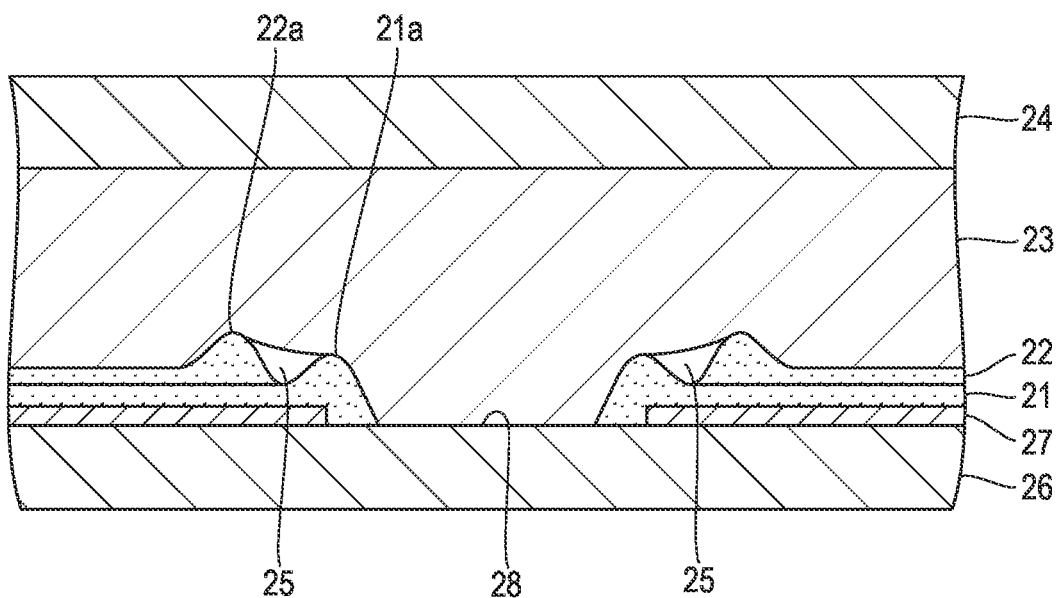
FIG. 4 is a sectional view illustrating the state in which a cover is mounted via an optical clear adhesive layer when the border segment of the insulating film around a through-hole has the same shape as in FIG. 3.
Figure 6:
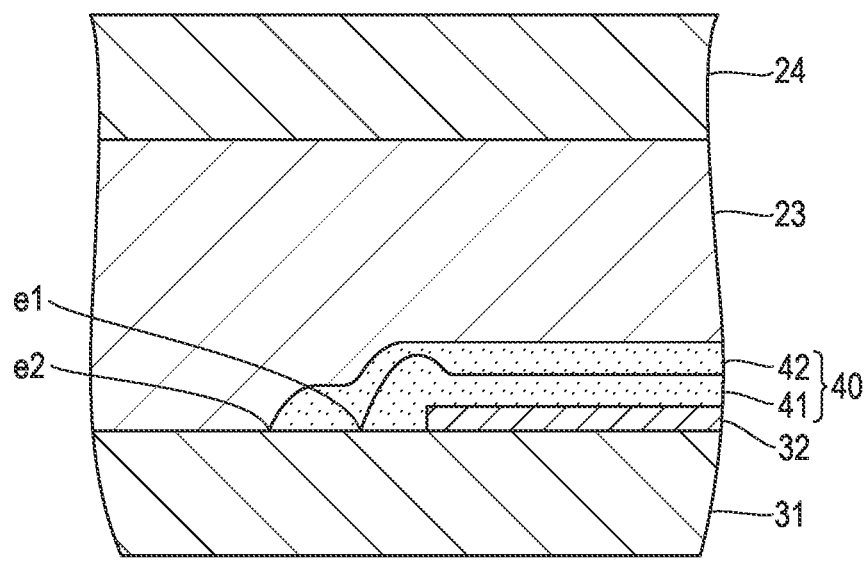
FIG. 6 is a sectional view illustrating the state in which a cover is mounted on the structure illustrated in FIG. 5A via an optical clear adhesive layer.

FIG. 6 illustrates the state in which the optical clear adhesive layer 23 is provided by pasting an optical clear adhesive sheet to the area on the board 31 including the border segments e1 and e2, and the cover 24 is mounted via the optical clear adhesive layer 23 as in FIG. 3 described above in a wiring board having the structure illustrated in FIG. 5A. The optical clear adhesive sheet is a sheet formed by sandwiching an optical clear adhesive film between two separators (two pieces of release paper) and is attached by peeling off the separators. Since no valleys are present on the surface of the insulating film 40, air bubbles are not generated in valleys unlike conventional cases and a good adhesive state can be obtained.

Figure 7:
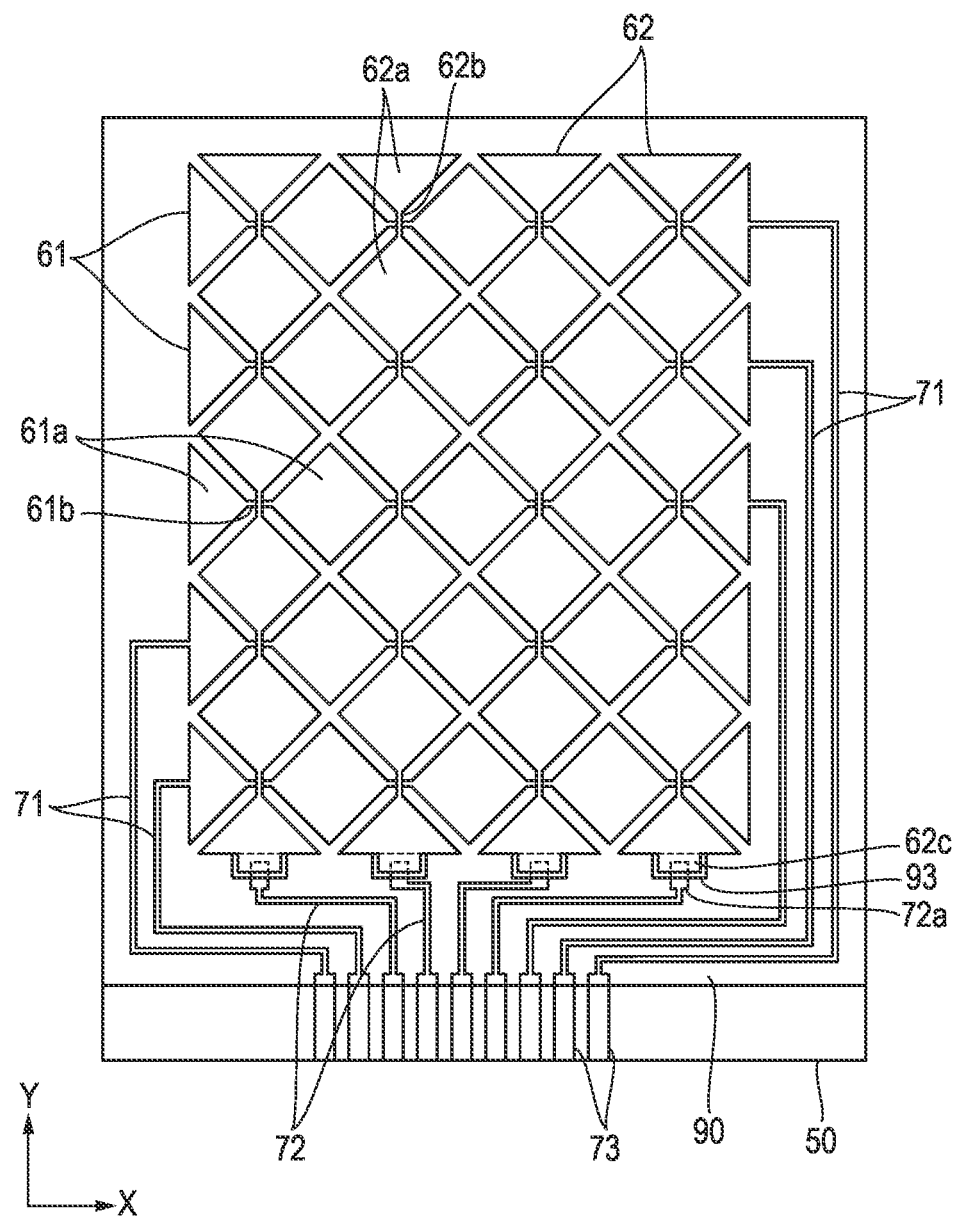
FIG. 7 is a plan view illustrating an outline of a touch panel to which a production method of the wiring board according to the present invention is applied.

FIG. 7 illustrates a capacitance type touch panel as a specific example of the wiring board produced by the production method of the wiring board according to the present invention. The touch panel has a rectangular clear board 50 on which a plurality of first sensor electrode rows 61 and a plurality of second sensor electrode rows 62 are formed. The plurality of first sensor electrode rows 61 extend in the X-direction parallel to the short sides of the clear board 50 and are disposed in parallel in the Y-direction parallel to the long sides of the clear board 50. The plurality of second sensor electrode rows 62 extend in the Y-direction and are disposed in parallel in the X-direction.

A lead-out wire 71 is drawn from one end of each of the first sensor electrode rows 61 and a lead-out wire 72 is drawn from one end of each of the second sensor electrode rows 62. These lead-out wires 71 and 72 extend to terminal portions 73 formed near the middle of one short side of the clear board 50.

Each of the first sensor electrode rows 61 includes a plurality of island electrodes 61a arranged in the X-direction and coupling portions 61b connecting adjacent island electrodes 61a and each of the second sensor electrode rows 62 includes a plurality of island electrodes 62a arranged in the Y-direction and coupling portions 62b connecting adjacent island electrodes 62a. Although FIG. 7 illustrates only the outer shapes of these components, in the touch panel according to the embodiment, the first and second sensor electrode rows 61 and 62 (specifically, the island electrodes 61a and the coupling portions 61b, and the island electrodes 62a and the coupling portions 62b) are configured by a conductive thin wire mesh having been printed and formed.

Figure 8A:
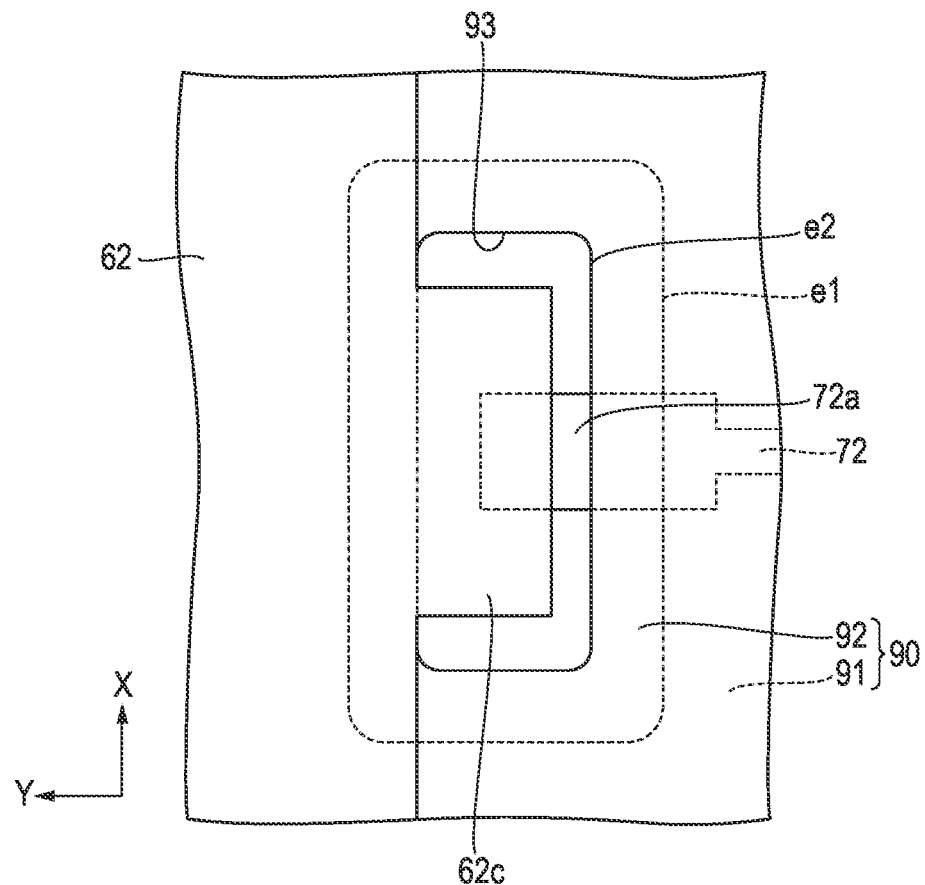
FIG. 8A is an enlarged plan view of a main portion in FIG. 7.
Figure 8B:
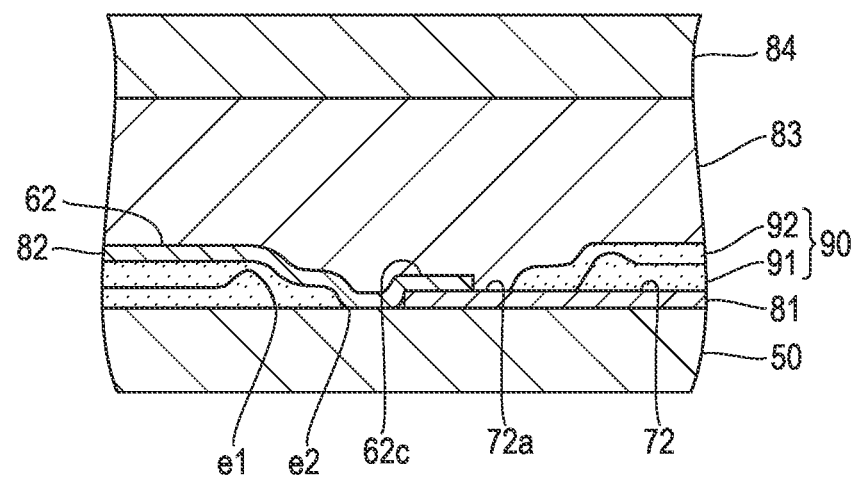
FIG. 8B is a sectional view of the portion illustrated in FIG. 8A when a cover is mounted via an optical clear adhesive layer.

FIG. 8A illustrates an enlarged view of the portion in which the lead-out wire 72 is drawn from the second sensor electrode row 62 and FIG. 8B illustrates the sectional structure of the touch panel so as to correspond to FIG. 8A.

As illustrated in FIG. 8B, the touch panel has the structure in which a first conductor pattern 81, an insulating film 90, and a second conductor pattern 82 are stacked in sequence on the clear board 50. In addition, although not illustrated in FIGS. 7 and 8A, a cover 84 is mounted on the second conductor pattern 82 via an optical clear adhesive layer 83. The plurality of first sensor electrode rows 61, the plurality of lead-out wires 71 and 72, and the plurality of terminal portions 73 belong to the first conductor pattern 81, and the plurality of second sensor electrode rows 62 belong to the second conductor pattern 82 that is insulated from the first conductor pattern 81 by the insulating film 90. The first sensor electrode rows 61 and the second sensor electrode rows 62 intersect each other so as to be insulated from each other, and the coupling portions 61b and 62b are located so as to overlap each other.

The insulating film 90 includes a first insulating film 91 and a second insulating film 92, and the positional relationship between the border segment e1 of the first region in which the first insulating film 91 is provided and the border segment e2 of the second region in which the second insulating film 92 is provided is the same as the positional relationship described with reference to FIG. 5A.

The connection between the second sensor electrode rows 62 and the lead-out wires 72 is performed via portions of through-holes 93 formed in the insulating film 90, and the through-holes 93 are provided at the lower ends in the Y direction of the second sensor electrode rows 62 as illustrated in FIG. 7. The details on the portions of the through-holes 93 will be described below with reference to FIGS. 8A and 8B.

The border segment e1 of the first region in which flexographic printing of the first insulating film 91 is performed forms the first closed curve as illustrated in FIG. 8A and the border segment e2 of the second region in which flexographic printing of the second insulating film 92 is performed forms the second closed curve located inside the first closed curve, so the insulating film 90 including the first insulating film 91 and the second insulating film 92 is provided with the through-hole 93 defined by the second closed curve.

A connection portion 72a of the lead-out wire 72 belonging to the first conductor pattern 81 is located in the through-hole 93. The second conductor pattern 82 is printed and formed on the insulating film 90 and in the through-hole 93, and a connection portion 62c extending from the second sensor electrode row 62 belonging to the second conductor pattern 82 is located in the through-hole 93. The connection portion 72a and the connection portion 62c are directly superposed in the through-hole 93 and connected to each other, thereby connecting the second sensor electrode row 62 and the lead-out wire 72 to each other. Although FIGS. 7 and 8A illustrate only the outer shapes of these components, in the touch panel according to the embodiment, the connection portion 72a and the connection portion 62c are configured by a conductive thin wire mesh having been printed and formed.

As described above, the touch panel has the structure in which the through-hole 93 is provided in the insulating film 90, the connection portion 72a belonging to the first conductor pattern 81 is located in the through-hole 93, the second conductor pattern 82 is formed on the insulating film 90 and in the through-hole 93, the connection portion 62c belonging to the second conductor pattern 82 is located in the through-hole 93, and the connection portion 72a and the connection portion 62c are directly superposed in the through-hole 93 and connected to each other. In this touch panel, the border segment e1 of the first region f1 is the first closed curve in which the connection portion 72a is located in the above-described first printing step and the border segment e2 of the second region f2 is the second closed curve located inside the first closed curve in the above-described second printing step.

Then, after the second curing step described above, the touch panel is produced by printing and forming the second conductor pattern 82 in which the connection portion 62c is located inside the second closed curve in the step of forming the second conductor pattern 82.

Furthermore, in this touch panel, after the step of forming the second conductor pattern 82, the optical clear adhesive layer 83 is provided in the area on the clear board 50 including the border segment e1 and the border segment e2 by pasting an optical clear adhesive sheet as in FIG. 6 described above and the cover 84 is mounted via the optical clear adhesive layer 83.

The details on the portion of the through-hole 93 provided in the insulating film 90 has been described above using a touch panel as an example. Since no valleys are present on the surface near the border segment surrounding the through-hole 93 of the insulating film 90, the insulating film 90 being formed by superposition printing of flexographic printing and including the first insulating film 91 and the second insulating film 92, the second conductor pattern 82 can be printed and formed successfully, and a problem such as generation of air bubbles around the through-hole 93 does not occur even when the optical clear adhesive layer 83 is disposed.

It should be noted that the cover 84 as an optical member is mounted via the optical clear adhesive layer 83 in the touch panel described above, but a display device may be mounted via the optical clear adhesive layer 83 depending on the disposition form of the touch panel.

The foregoing description of the embodiment of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of producing a wiring board that comprises a board, a conductor pattern on the board, and an insulating film covering at least part of the conductor pattern, the method comprising:
   transferring first ink of insulating film material from a first flexographic plate onto the board so that the first ink of insulating film material is provided in a first region covering said at least part of the conductor pattern on the board, the first region having a first border segment;
   curing the first ink of insulating film material provided in the first region;
   transferring second ink of insulating film material from a second flexographic plate onto the board so that the second ink of insulating film material is provided in a second region covering at least part of the first region on the board, the second region having a second border segment that is located beyond the first region, wherein a shortest distance between the first border segment and any point belonging to the second border segment is not less than 50 µm and not greater than 400 µm; and
   curing the second ink of insulating film material provided in the second region, whereby the insulating film is gained as a combination of cured products of the first ink of insulating film material and the second ink of insulating film material.

2. The method according to claim 1, further comprising pasting an optical clear adhesive sheet on a surface region of the wiring board that covers the first border segment and the second border segment after the curing of the second ink of insulating film material.

3. The method according to claim 1, wherein the first region has a void surrounded by a first closed curve that is defined as the first border segment such that the conductor pattern has a first connection portion belonging to the conductor pattern and located inside the first closed curve, the first connection portion emerging from the first ink of insulating film material transferred onto the board in the transferring of the first ink of insulating film material,
   the second region has a void surrounded by a second closed curve that is defined as the second border segment, the second closed curve being located inside the first closed curve such that the first connection portion is located inside the second closed curve, the first connection portion still emerging from the second ink of insulating film material transferred onto the board in the transferring of the second ink of insulating film material, whereby a through-hole surrounded by the second closed curve is formed in the insulating film by the curing of the second ink of insulating film material, the first connection portion being located in the through-hole, and
   the method further comprises forming a second conductor pattern by printing after the curing of the second ink of insulating film material, the second conductor pattern extending both inside the through-hole and over the insulating film such that the second conductor pattern has a second connection portion belonging the second conductor pattern that is superposed directly on the first connection portion in the through-hole, whereby the wiring board is gained having a structure in which the conductor pattern partly covered by the insulating film and the second conductor pattern partly formed over the insulating film are connected to each other through the through-hole.

4. The method according to claim 3, further comprising pasting an optical clear adhesive sheet on a surface region of the wiring board that covers the first border segment and the second border segment after the forming of the second conductor pattern.

\* \* \* \* \*